US009350305B2

(12) United States Patent
David et al.

(10) Patent No.: US 9,350,305 B2
(45) Date of Patent: *May 24, 2016

(54) PREAMPLIFIER CIRCUIT FOR A MICROELECTROMECHANICAL CAPACITIVE ACOUSTIC TRANSDUCER

(71) Applicant: STMicroelectronics S.r.l., Agrate Brianza (IT)

(72) Inventors: Filippo David, Milan (IT); Igino Padovani, Novate Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 207 days.

This patent is subject to a terminal disclaimer.

(21) Appl. No.: 14/049,126

(22) Filed: Oct. 8, 2013

(65) Prior Publication Data

US 2014/0037113 A1    Feb. 6, 2014

Related U.S. Application Data

(63) Continuation of application No. 12/826,210, filed on Jun. 29, 2010, now Pat. No. 8,582,787.

(30) Foreign Application Priority Data

Jun. 30, 2009   (IT) .............................. TO2009A0495

(51) Int. Cl.
*H03F 3/45*    (2006.01)
*G05F 3/30*    (2006.01)
(Continued)

(52) U.S. Cl.
CPC .. *H03F 3/45* (2013.01); *G05F 3/30* (2013.01); *H03F 3/187* (2013.01);
(Continued)

(58) Field of Classification Search
CPC ....... H03F 1/3264; H03F 1/3211; H03F 3/45; H03F 2200/03

USPC .............................. 381/120, 91–92, 111–114
See application file for complete search history.

(56) References Cited

U.S. PATENT DOCUMENTS 6,014,020 A    1/2000   Kuttner
6,160,450 A    12/2000  Eschauzier et al.
(Continued)

FOREIGN PATENT DOCUMENTS

WO         9414239 A1    6/1994

OTHER PUBLICATIONS

Malcovati, P., et al., "Curvature-Compensated BiCMOS Bandgap with 1-V Supply Voltage", IEEE Journal of Solid-State Circuits, Jul. 2001, vol. 36, No. 7, pp. 1076-1081.
(Continued)

*Primary Examiner* — Disler Paul
(74) *Attorney, Agent, or Firm* — Seed IP Law Group PLLC

(57) ABSTRACT

Described herein is a preamplifier circuit for a capacitive acoustic transducer provided with a MEMS detection structure that generates a capacitive variation as a function of an acoustic signal to be detected, starting from a capacitance at rest; the preamplifier circuit is provided with an amplification stage that generates a differential output signal correlated to the capacitive variation. In particular, the amplification stage is an input stage of the preamplifier circuit and has a fully differential amplifier having a first differential input (INP) directly connected to the MEMS detection structure and a second differential input (INN) connected to a reference capacitive element, which has a value of capacitance equal to the capacitance at rest of the MEMS detection structure and fixed with respect to the acoustic signal to be detected; the fully differential amplifier amplifies the capacitive variation and generates the differential output signal.

26 Claims, 5 Drawing Sheets

(51) Int. Cl.
*H03F 3/187* (2006.01)
*H04R 19/01* (2006.01)
*H03F 1/32* (2006.01)

(52) U.S. Cl.
CPC ....... *H03F 3/45183* (2013.01); *H03F 3/45192* (2013.01); *H03F 3/45475* (2013.01); *H03F 3/45632* (2013.01); *H04R 19/01* (2013.01); *H03F 1/3211* (2013.01); *H03F 2200/03* (2013.01); *H03F 2200/213* (2013.01); *H03F 2200/447* (2013.01); *H03F 2203/45136* (2013.01); *H03F 2203/45244* (2013.01); *H03F 2203/45392* (2013.01); *H03F 2203/45456* (2013.01); *H03F 2203/45628* (2013.01); *H03F 2203/45631* (2013.01)

(56) References Cited

U.S. PATENT DOCUMENTS

| | | |
|---|---|---|
| 8,295,512 B2 * | 10/2012 | Deruginsky et al. .......... 381/113 |
| 8,374,363 B2 | 2/2013 | Onishi |
| 2008/0152171 A1 | 6/2008 | Hovesten et al. |
| 2008/0191800 A1 * | 8/2008 | Fang .................... H03F 1/26 330/9 |
| 2009/0161890 A1 | 6/2009 | Lin |
| 2009/0206932 A1 * | 8/2009 | Wu ................. 330/284 |
| 2010/0166228 A1 | 7/2010 | Steele et al. |
| 2010/0254544 A1 * | 10/2010 | Kimura ................ H04B 15/005 381/94.1 |

OTHER PUBLICATIONS

Torelli, G., et al., "A CMOS micropower input amplifier for hearing aids", Microelectronics Journal, Mackintosh Publications Ltd. Luton, GB, vol. 27, No. 6, Sep. 1, 1996, pp. 477-484.

Hsu, Yu-Chun, et al., "A Realization of Low Noise Silicon Acoustic Transducer Interface Circuit", IEEE, 2007, 4 pages.

Picolli, L., et al., "A Fourth-Order, Audio-Bandwidth, 87.5-dB SNDR EΔ Modulator for MEMS Microphones", ISCAS 2009, IEEE International Symposium on, IEEE, May 24, 2009, pp. 1325-1328.

* cited by examiner

PREAMPLIFIER CIRCUIT FOR A MICROELECTROMECHANICAL CAPACITIVE ACOUSTIC TRANSDUCER

BACKGROUND

1. Technical Field

The present disclosure relates to a preamplifier circuit for an acoustic transducer, in particular a MEMS (microelectromechanical system) capacitive microphone, to which the ensuing treatment will make explicit reference without this implying any loss of generality.

2. Description of the Related Art

As is known, there is a currently widespread use of acoustic transducers of a capacitive type, for example, MEMS capacitive microphones, in a wide range of applications, in particular within portable devices, in which it proves advantageous to reduce dimensions and levels of consumption.

A MEMS capacitive microphone generally comprises a microelectromechanical structure having a mobile electrode, provided as diaphragm or membrane, set facing a fixed electrode, to provide the plates of a variable-capacitance detection capacitor.

The mobile electrode is generally anchored to a substrate at a perimetral portion thereof, whilst a central portion thereof is free to move or bend in response to the pressure exerted by incident sound waves. The mobile electrode and the fixed electrode provide a capacitor, and bending of the membrane constituting the mobile electrode, as a function of the acoustic signal to be detected, causes a capacitance variation of this capacitor with respect to a value of capacitance at rest (which the capacitor assumes in the absence of acoustic signals).

In greater detail, and with reference to FIG. 1, a detection structure 1 of a MEMS capacitive microphone of a known type comprises a substrate 2 of semiconductor material, for example silicon; a cavity 3 (generally known as "back-chamber") is made in the substrate 2, for example via chemical etching from the back. A membrane or diaphragm 4 is coupled to the substrate 2 and closes the back-chamber 3 at the top; the membrane 4 is flexible and, in use, undergoes deformation as a function of the pressure of the sound waves impinging thereon from the back-chamber 3. A rigid plate 5 (generally known as "back-plate") is set above the membrane 4 and faces it, via the interposition of spacers 6 (for example, made of insulating material, such as silicon oxide). The back-plate 5 constitutes the fixed electrode of a capacitor with variable capacitance, the mobile electrode of which is constituted by the membrane 4, and has a plurality of holes 7, for example with circular cross section, which are designed to enable free circulation of air towards the same membrane 4.

Capacitive microphones, and in particular MEMS microphones, receive an appropriate electrical biasing so that they can be used as transducers of acoustic signals into electrical signals. In particular, in order to guarantee performance levels sufficient for common applications, microphones are required to be biased at high voltages (for example, 15 V-20 V), typically much higher than the ones at which a corresponding readout-interface circuit is supplied (logic voltages, for example, of 1.6 V-3 V). For this purpose, it is common to use charge-pump voltage-booster circuits made with integrated technology, which are capable of generating high voltage values starting from reference voltages of a lower value.

In use, the capacitance variations generated by the detection structure are transformed by a purposely provided readout-interface circuit into an electrical signal, which is supplied as output signal of the acoustic transducer. Since the capacitive variations are of an extremely low value (lower than one picofarad, generally in the femtofarad-picofarad range), the readout-interface circuit has a high signal-to-noise ratio in the conversion of the capacitive variations into the electrical signal to be used for the subsequent processing operations. In addition, portable applications have low supply voltages, for example in the region of 1.6 V or lower.

FIG. 2 shows a traditional circuit arrangement for reading of a MEMS capacitive microphone, the detection structure 1 of which is schematically represented as a capacitor with variable capacitance. This circuit arrangement, which is designed to operate as preamplifier of the capacitive variation signals generated by the detection structure, is, for example, described in Yu-Chun Hsu, Wen-Chieh Chou, Lu-Po Liao, Ji-Ching Tsai "A Realization of Low Noise Silicon Acoustic Transducer Interface Circuit", VLSI Design, Automation and Test, 2007; VLSI-DAT 2007, International Symposium, Apr. 25-27, 2007, pp. 1-4.

In particular, a first terminal $N_1$ (constituted, for example, by the back-plate 5—see FIG. 1) of the detection structure 1 receives a first biasing voltage $V_{BIAS}$ from an appropriate biasing circuit (typically comprising a charge-pump stage, not illustrated), whilst a second terminal $N_2$ (for example, constituted by the membrane 4—see FIG. 1) of the detection structure 1 is connected to the high-impedance input of an associated preamplifier reading circuit (also defined as "front-end"), designated as a whole by 10.

The preamplifier circuit 10 includes a buffer stage 11, having an input connected to the aforesaid second terminal $N_2$, and constituted by a stage in source-follower configuration, formed by a PMOS transistor 12. The PMOS transistor 12 has its gate terminal connected to the second terminal $N_2$, its source terminal connected to a biasing-current generator 13, in turn connected to a line receiving a supply voltage $V_{DD}$, and its drain terminal connected to a reference terminal (possibly coinciding, as in the case illustrated, with the ground terminal GND of the preamplifier circuit 10). The buffer stage 11 converts the capacitive variation signal generated by the detection structure 1 into an electrical voltage signal that can be used for the subsequent processing operations.

The input of the buffer stage 11 is biased at a fixed voltage through a resistance of a value sufficiently high as to guarantee the biasing charge on the detection structure 1 of the MEMS capacitive microphone to remain substantially fixed. A resistive biasing element 14, having a resistance of a high value, of the order of tens of gigaohms (or higher), is consequently connected between the input of the buffer stage 11 (the aforesaid second terminal $N_2$) and a line at a second biasing voltage $V_{REF}$ (operating, for example, as a reference). Due to the fact that, as it is known, it is not possible in integrated-circuit technology to produce resistors with such high values of resistance, a pair of diodes in antiparallel configuration is usually employed to provide the resistive biasing element 14, which provide a sufficiently high resistance when there is a voltage drop across them of small value (depending upon the technology, for example less than 100 mV) and no d.c. current flows therein.

The preamplifier circuit 10 further comprises an amplification stage 15, provided with resistive feedback, connected in cascaded fashion to the output of the buffer stage 11. The amplification stage 15, in addition to implementing an appropriate gain function, performs the conversion of the single-ended signal coming from the buffer stage 11 into a differential signal between its two output terminals Out1, Out2. In greater detail, the amplification stage 15 comprises: an amplifier 16 having inverting and non-inverting inputs and two outputs connected to the aforesaid output terminals Out1, Out2; a first feedback resistor 18a, connected between the non-inverting input of the amplifier 16 and the first output terminal Out1; a second feedback resistor 18b, connected between the inverting input of the amplifier 16 and the second output terminal Out2 and having the same value of resistance as the first feedback resistor 18a; a first gain resistor 19a, connected between the non-inverting input of the amplifier 16 and the output of the buffer stage 11; and a second gain resistor 19b, connected between the inverting input of the amplifier 16 and the line at the second biasing voltage $V_{REF}$.

Circuit solutions have also been proposed (see US 2008/152171), in which, instead of a follower stage at input to the reading chain, a gain stage of the common-emitter type is used. In this case, however, performance levels are limited by the reduced output dynamics of the gain stage.

BRIEF SUMMARY

The present Applicant has found that the aforesaid preamplifier circuit 10 has a series of problems from the standpoint of noise, namely:

- the noise of the buffer stage 11 (in follower configuration) is added to the useful signal (indicative of the capacitive variation of the detection structure 1), before this is amplified so that the first stage of the reading chain, used for a correct biasing of the MEMS capacitive microphone, actually worsens the signal-to-noise ratio without, however, amplifying the useful signal;
- a possible disturbance on the first biasing voltage $V_{BIAS}$ of the MEMS capacitive microphone is entirely brought at output, behaving in the same way as a useful signal component; and
- the disturbance possibly present on the supply voltage $V_{DD}$ directly affects the output signal.

One embodiment is a readout interface, in particular a corresponding preamplifier circuit, for an acoustic transducer, that will enable the above drawbacks to be overcome, and in particular will enable improvement of the noise performance levels.

According to the one embodiment, a preamplifier circuit for an acoustic transducer and a corresponding acoustic transducer are consequently provided, as defined in claims 1 and 15, respectively.

BRIEF DESCRIPTION OF THE SEVERAL VIEWS OF THE DRAWINGS

Preferred embodiments are now described, purely by way of non-limiting example and with reference to the attached drawings, wherein.

DETAILED DESCRIPTION

Figure 1:
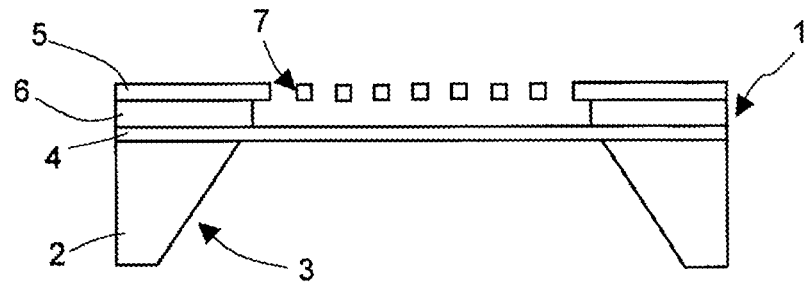
FIG. 1 is a schematic cross section of the microelectromechanical detection structure of a capacitive acoustic transducer of a known type.
Figure 2:
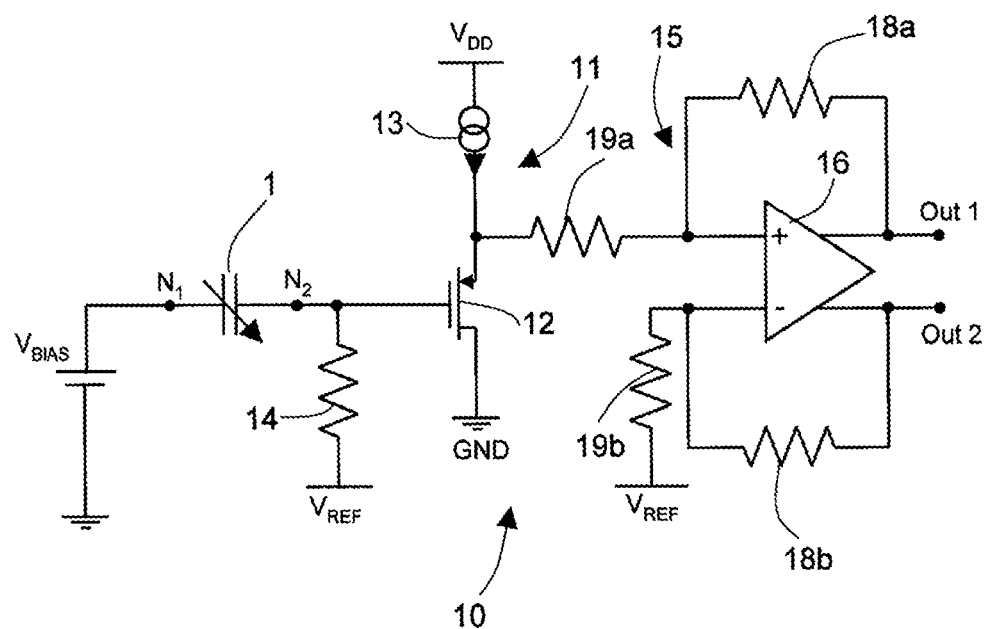
FIG. 2 shows a preamplifier circuit of a capacitive acoustic transducer of a known type.

As will be clarified in detail in what follows, one embodiment envisages the use, as the first preamplifier stage of the readout interface associated to the detection structure of a MEMS capacitive microphone (for example, once again made as described previously with reference to FIG. 1), of an amplification stage of a fully differential type, i.e., having both differential inputs and differential outputs. This input stage enables a correct biasing of the detection structure and at the same time enables amplification of the useful signal and conversion thereof from single-ended to differential, eliminating the noise possibly present on the biasing voltage and/or on the supply voltage.

Figure 3:
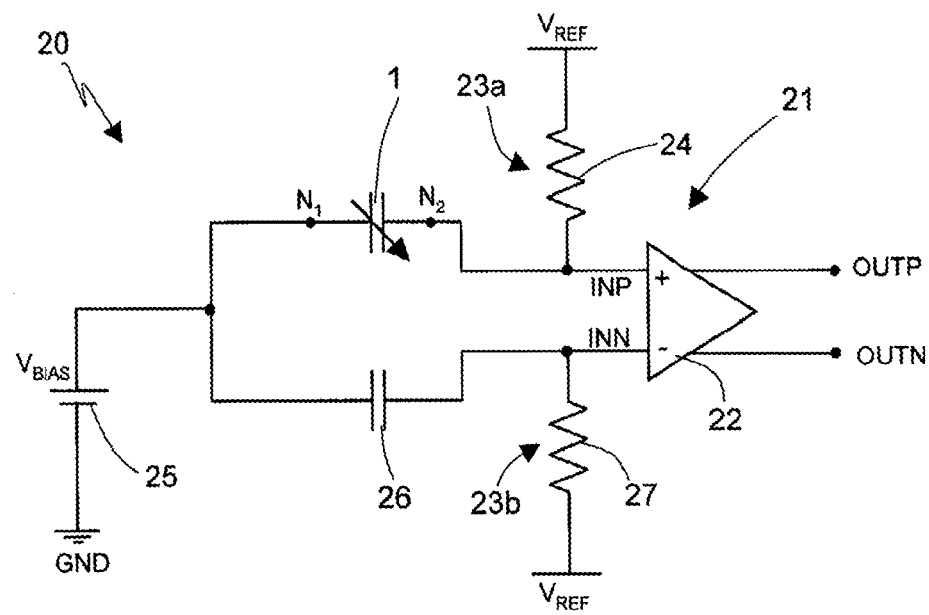
FIG. 3 is a schematic representation of a preamplifier circuit for a capacitive acoustic transducer, according to one embodiment.

In detail, and with reference to FIG. 3 (where elements similar to others already described previously are designated by the same references), the preamplifier circuit, here designated by 20, associated to the detection structure 1 of a MEMS capacitive microphone, in this case comprises an amplification stage 21 of the fully differential type having a high input impedance.

The amplification stage 21 is formed by a differential amplifier 22, having two inputs, an inverting input (designated by INN) and a non-inverting input (designated by INP), and two outputs, which define respective output terminals of the preamplifier circuit 20, designated by OUTN (negative output) and OUTP (positive output), across which it supplies a differential output signal, correlated to the capacitive variation detected by the detection structure 1.

The non-inverting input INP of the differential amplifier 22 is connected to a detection branch, and in particular to the detection structure 1 (to the corresponding second terminal $N_2$) and to the associated biasing network 23a, including: a first resistive biasing element 24, having a high value of resistance (for example, of the order of tens of gigaohms or higher) and made, for example, by a pair of diodes in antiparallel configuration, connected between the second terminal $N_2$ of the detection structure 1 and a line set at the second biasing voltage $V_{REF}$; and a voltage-generator element 25, connected between the reference terminal and the first terminal $N_1$ of the detection structure 1, to which it supplies the first biasing voltage $V_{BIAS}$.

The inverting input INN of the differential amplifier 22 is, instead, connected to a reference branch, referred to as "dummy" (i.e., not corresponding to a real detection structure), constituted by a dummy capacitor 26, having a value of capacitance equal to the capacitance at rest (i.e., in the absence of a detection signal) of the detection structure 1, and by a respective biasing network 23b.

In particular, a second resistive biasing element 27, which also has a high value of resistance (for example, of the order of tens of gigaohms or higher) equal to the value of resistance of the first resistive biasing element 24, and for example provided by a pair of diodes in antiparallel configuration, is connected between the aforesaid inverting input INN of the differential amplifier 22 and the line set at the second biasing voltage $V_{REF}$ (in such a way as to be connected to the same biasing voltage $V_{REF}$ applied to the detection structure 1). The aforesaid reference generator element 25 is moreover connected to the dummy capacitor 26, which consequently has, in use, a terminal in common with the detection structure 1 (with which it shares the first terminal $N_1$). The reference branch is hence altogether symmetrical to the detection branch of the preamplifier circuit 20.

In use, the amplification stage 21, by virtue of the fully differential configuration, thus amplifies just the useful signal, in particular the capacitive variation generated by the detection structure 1 with respect to the situation at rest, and generates at output a differential signal correlated to this capacitive variation. Any possible disturbance on the biasing voltage ($V_{BIAS}$, $V_{REF}$) is instead eliminated by the amplification stage 21, again by virtue of the fully differential configuration, given that the reference branch is connected exactly to the same biasing voltage $V_{BIAS}$, $V_{REF}$ as that to which the detection structure 1 is connected. In particular, the disturbance is treated as a variation of the common-mode signal at input to the differential amplifier 22 (being added to the common-mode signal) and, as has been said, substantially cancelled out by the amplifier.

One embodiment envisages provision of an amplifier the use of which is particularly advantageous in the aforesaid preamplifier circuit 20, and which in particular: has a high input impedance and a low noise; implements a structure of a fully differential type; and has a stable gain with respect to process spread and to power supply and/or temperature variations.

Figure 4:
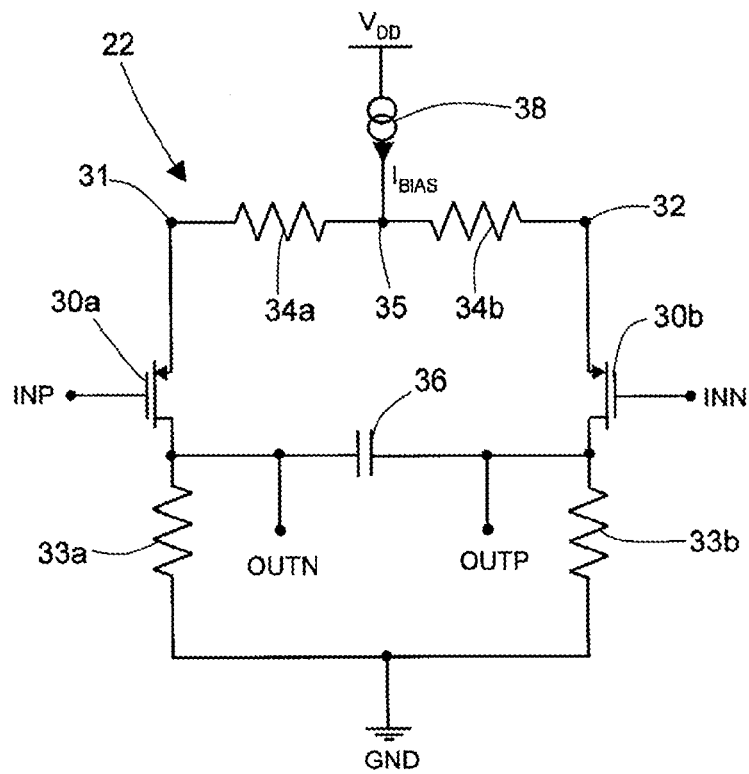
FIG. 4 shows a circuit diagram of a differential amplifier in the preamplifier circuit of FIG. 3.

FIG. 4 shows a possible implementation of a differential amplifier satisfying the above characteristics, once again designated by the reference number 22.

In detail, the differential amplifier 22 has an altogether symmetrical structure having at input a pair of PMOS transistors so as to contain noise, namely: a first PMOS transistor 30a, having its gate terminal connected to the non-inverting input INP of the differential amplifier 22, its drain terminal defining the second (negative) output terminal OUTN, and its source terminal connected to a first intermediate node 31; and a second PMOS transistor 30b, having its gate terminal connected to the inverting input INN of the differential amplifier 22, its drain terminal defining the first (positive) output terminal OUTP, and its source terminal connected to a second intermediate node 32.

The differential amplifier 22 further comprises: a pair of load resistors having the same value of resistance, and in particular a first load resistor 33a connected between the reference terminal of the preamplifier circuit 20 and the second output terminal OUTN, and a second load resistor 33b connected between the reference terminal of the preamplifier circuit 20 and the first output terminal OUTP; and a pair of degeneration resistors having the same value of resistance, and in particular a first degeneration resistor 34a and a second degeneration resistor 34b, connected between a third intermediate node 35 and, respectively, the first intermediate node 31 and the second intermediate node 32.

The differential amplifier 22 further comprises: a filter capacitor 36, connected between the first output terminal OUTP and the second output terminal OUTN in such a way as to provide, at the output, a low-pass filter that enables appropriate filtering of the noise of the amplification stage 21 and thus reduction of the total wide-band noise; and a biasing-current generator 38, connected between a line set at the supply voltage $V_{DD}$ and the third intermediate node 35, and designed to supply, on the same third intermediate node 35, a biasing current $I_{BIAS}$ for proper operation of the circuit.

The circuit arrangement described for the differential amplifier 22 advantageously has a high input impedance and enables a low noise to be obtained for the amplification stage 21, thanks in particular to the presence of the pair of PMOS transistors 30a, 30b connected at the input and of the pair of load resistors 33a, 33b, and moreover thanks to the filter capacitor 36 connected at the output. In addition, the symmetrical and differential configuration enables rejection of any possible disturbance on the supply voltage $V_{DD}$.

In addition, it may be shown (as will be clarified in what follows) that it is sufficient to impose an appropriate condition on the value of the biasing current $I_{BIAS}$ for the differential amplifier 22 to be stable with respect to process spread and temperature variations.

In detail, the voltage in a condition of biasing of one of the output terminals, for example of the second output terminal OUTN, is generally given by the following expression:

$$V(OUTN)=R_L \cdot I_{BIAS}=R_L \cdot I_{BIAS}+\Delta R_L \cdot I_{BIAS}+R_L \cdot \Delta I_{BIAS}+\Delta R_L \cdot \Delta I_{BIAS}$$

where $R_L$ is the resistance of the first load resistor 33a (coinciding with the resistance of the second load resistor 33b), $\Delta R_L$ is the variation of the same resistance due to a possible process spread, and likewise $\Delta I_{BIAS}$ is the variation of the biasing current $I_{BIAS}$ due to a process spread. In the presence of variability of the biasing current $I_{BIAS}$, independent of the variability of the resistance $R_L$, the aforesaid voltage V(OUTN) is consequently not stable in regard to process spread or temperature variations.

For this reason, one embodiment envisages biasing of the differential amplifier 22 with an appropriate biasing current $I_{BIAS}$, the value of which is correlated to the resistance $R_L$ according to the relation:

$$I_{BIAS}=V_{STAB}/(\alpha \cdot R_L)$$

where $V_{STAB}$ is a voltage that is stable with respect to process spread and temperature variations, and $\alpha$ is a constant of proportionality. As will be described in detail hereinafter, this stable voltage can, for example, be the bandgap reference voltage $V_{BG}$ generated by a reference generator of a bandgap type.

Evidently, using a biasing current $I_{BIAS}$ in the aforesaid form (i.e., having a relation of proportionality with the resistance $R_L$ of the load resistors 33a, 33b), the voltage on the output terminals of the differential amplifier 22 is stable, irrespective of the process spread and the temperature variations. In fact, in this case, the voltage of the aforesaid second output terminal can be expressed as:

$$V(OUTN)=R_L \cdot I_{BIAS}=R_L \cdot V_{BG}/(\alpha \cdot R_L)=V_{BG}/\alpha$$

thus being proportional only to a voltage that is stable with respect to process spread and temperature variations (the bandgap reference voltage $V_{BG}$) on the basis of the constant of proportionality a; the dependence upon the resistance $R_L$ is, instead, eliminated.

It may moreover be shown (using the small-signal models of the various transistors) that the gain G of the differential amplifier 22 can be expressed as follows:

$$G = \frac{R_L}{1/g_m + R_D} = \frac{V_{RL}}{I_{BIAS}/(2 \cdot g_m) + V_D}$$

where $R_D$ is the resistance of the degeneration resistors 34a, 34b, $g_m$ is the transconductance of the pair of PMOS transistors 30a, 30b, $V_{RL}$ is the voltage across each of the load resistors 33a, 33b when they are traversed by the biasing current $I_{BIAS}$, and $V_D$ is the voltage across each of the degeneration resistors 30a, 30b when traversed by the same biasing current $I_{BIAS}$.

In order to optimize the signal-to-noise ratio of the differential amplifier 22, the PMOS transistors 30a, 30b of the input pair are biased in subthreshold condition, so that their transconductance $g_m$ can be expressed as:

$$g_m = \frac{I_{BIAS}}{2 \cdot n \cdot V_{th}}$$

where $V_{th}$ is the threshold voltage of the PMOS transistors 30a, 30b, and n is a slope coefficient, depending on the CMOS technology used in the production process.

The gain G of the differential amplifier 22 is hence expressed by the following resultant relation:

$$G = \frac{V_{RL}}{n \cdot V_{th} + V_D}$$

depending only on two voltages ($V_{RA}$ and $V_D$) which are stable with respect to temperature variations and process spread.

The dependence of the gain G upon the temperature is hence markedly contained; in the practical cases, it is possible to obtain a variation lower than 1.5 dB over a temperature range of 100° C. In addition, by sizing appropriately the circuit elements of the differential amplifier 22 it is possible to obtain gains of variable value between 0 dB and 20 dB (or higher).

A further embodiment hence envisages generation of the aforesaid stable voltage $V_{STAB}$ (and the associated biasing current $I_{BIAS}$) using a reference generator of a bandgap type, for example of the type as the one described in the document: P. Malcovati, F. Maloberti, C. Fiocchi, M. Pruzzi "Curvature-Compensated BiCMOS Bandgap with 1-V Supply Voltage", IEEE Journal of Solid-State Circuits, July 2001, pp. 52-55, vol. 36, No. 7.

Figure 5:
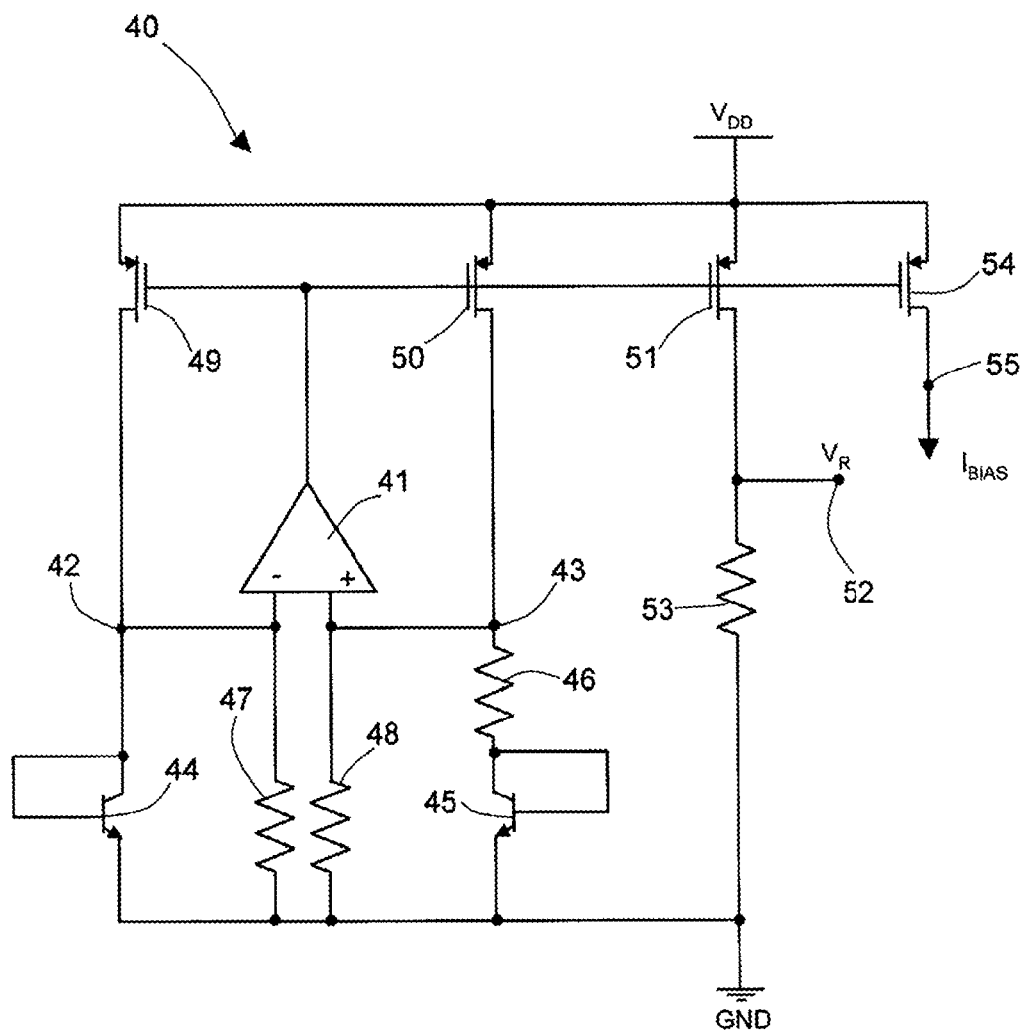
FIG. 5 shows a circuit diagram of a reference generator in the preamplifier circuit of FIG. 3.

FIG. 5 shows a reference generator 40, of the bandgap type, which can be used for generation of the biasing current $I_{BIAS}$ in the aforesaid differential amplifier 22.

In brief (see the document cited for a detailed description), the reference generator 40 comprises: an operational amplifier 41, having an inverting input connected to a first internal node 42 and a non-inverting input connected to a second internal node 43; and a pair of bipolar transistors (of an NPN type), which are diode-connected (i.e., they have a respective base terminal connected to the respective collector terminal), and in particular: a first bipolar transistor 44 connected between the reference terminal (coinciding with the ground GND of the preamplifier circuit 20) and the first internal node 42; and a second bipolar transistor 45, connected between the same reference terminal and the second internal node 43 by interposition of a first reference resistor 46. The bipolar transistors 45, 46 have an emitter-area ratio of 1 to N.

In addition, a second reference resistor 47 and a third reference resistor 48 are connected between the inverting input and the non-inverting input, respectively, of the operational amplifier 41 and the reference terminal. In particular, the first reference resistor 46, the second reference resistor 47, and the third reference resistor 48 have the same value of resistance, which is moreover proportional (via the proportionality constant α) to the resistance value $R_L$ of the load resistors 33a, 33b of the differential amplifier 22. The reference resistors 46, 47 and 48 are moreover matched to the load resistors 33a, 33b, hence being of the same type and obtained with the same technology (for example, in one and the same resistive layer) as the load resistors 33a, 33b, consequently having substantially the same electrical characteristics and being substantially subject to the same process spread and temperature variations.

The reference generator 40 further comprises: a first PMOS transistor 49 and a second PMOS transistor 50 connected between the line receiving the supply voltage $V_{DD}$ and, respectively, the first and second internal nodes 42, 43, and having their gate terminals connected together and to the output of the operational amplifier 41; a third PMOS transistor 51 having its gate terminal connected to the output of the operational amplifier 41 and connected between the line receiving the supply voltage $V_{DD}$ and a voltage output node 52, on which a reference voltage $V_R$ is supplied (in particular, the reference voltage $V_R$ is the voltage on an output resistor 53 connected between the reference terminal and the voltage output node 52); and a fourth PMOS transistor 54, which also has its gate terminal connected to the output of the operational amplifier 41 and connected between the line receiving the supply voltage $V_{DD}$ and a current output node 55 on which a reference current is supplied, in particular coinciding in this case with the biasing current $I_{BIAS}$.

In use, the operational amplifier 41 forces a same voltage value on the first internal node 42 and on the second internal node 43, and a same current value through the first and second PMOS transistors 49, 50; this current value moreover coincides with the value of the biasing current $I_{BIAS}$.

The bipolar transistors 44, 45 draw, in use, the same current, so that the difference between the corresponding base-emitter voltages depends only upon the emitter-area ratio N:

$$\Delta V_{BE} = V_T \cdot \ln(N)$$

where $V_T$ is the thermal voltage (given by the known expression $V_T = K \cdot T/q$, where T is the absolute temperature, K is the Boltzman constant, q is the unit electron charge).

Consequently, applying simple considerations on the currents present on the second internal node 43, the biasing current $I_{BIAS}$ can be expressed as:

$$I_{BIAS} = \frac{V_T \cdot \ln(N)}{\alpha R_L} + \frac{V_{BE}}{\alpha R_L} = \frac{V_T \cdot \ln(N) + V_{BE}}{\alpha R_L}$$

In the above expression, the term $V_T \cdot \ln(N)$ represents a PTAT factor (proportional to absolute temperature), having a positive coefficient of variation with temperature, whilst the factor $V_{BE}$ has a negative coefficient of variation with temperature. The sum of these factors generates, in a known way, the bandgap reference voltage $V_{BG}$, which has a substantially constant value as the temperature varies, so that the biasing current $I_{BIAS}$, as desired, can be effectively expressed in the form:

$$I_{BIAS} = V_{BG}/(\alpha \cdot R_L)$$

A further embodiment envisages that, in the case where low-impedance outputs are required for the preamplifier circuit 20, the amplification stage 21 is followed by an output stage, for example constituted by appropriate output buffers.

Figure 6:
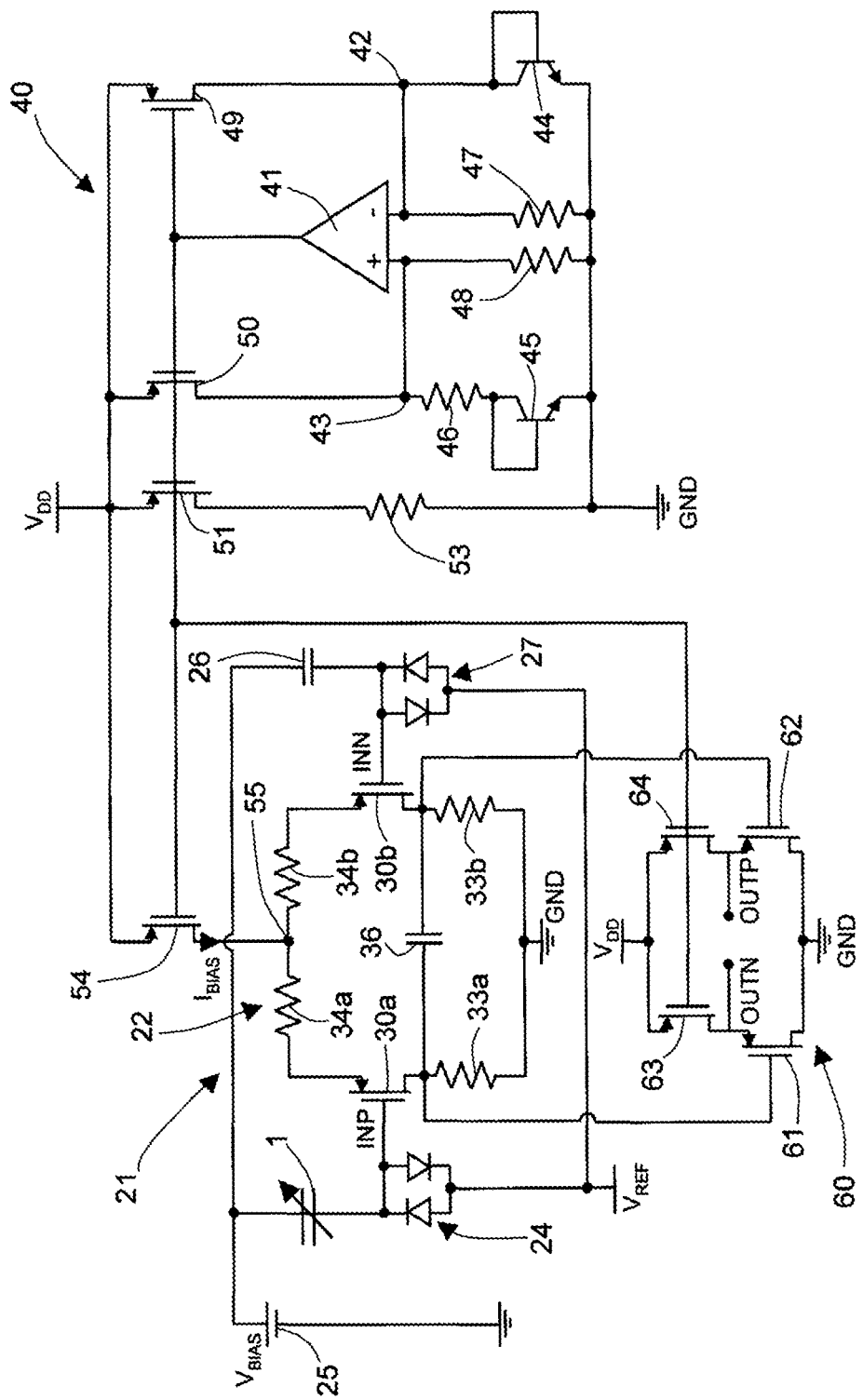
FIG. 6 shows a preamplifier circuit for a capacitive acoustic transducer, according to a further embodiment.

FIG. 6 shows a possible complete circuit implementation of the preamplifier circuit 20 (including the stages previously described individually), on the hypothesis that an output stage, designated by 60, is provided, constituted by two buffers (one per differential branch) made by a respective PMOS transistor in source-follower configuration. It may be noted that, as shown in FIG. 6, the first and second resistive biasing elements 24, 27 are implemented by a respective pair of diodes in antiparallel configuration.

In detail, the output stage 60 comprises: a first output PMOS transistor 61, having its gate terminal connected to the drain terminal of the first PMOS transistor 30a of the differential amplifier 22, its drain terminal connected to the reference terminal, and its source terminal that defines in this case the second (negative) output terminal OUTN of the preamplifier circuit 20; and a second output PMOS transistor 62, having its gate terminal connected to the drain terminal of the second PMOS transistor 30b of the differential amplifier 22, its drain terminal connected to the reference terminal, and its source terminal defining in this case the first (positive) output terminal OUTP of the preamplifier circuit 20.

The output stage 60 further comprises a pair of further PMOS transistors 63, 64, operatively coupled to the reference generator 40, and having: their gate terminals connected to the output of the operational amplifier 41 of the aforesaid reference generator 40, their source terminals connected to the line receiving the supply voltage $V_{DD}$, and their drain terminals, supplying the biasing current $I_{BIAS}$ respectively on the second and first output terminals OUTN, OUTP.

Advantageously, the noise possibly added by the output stage 60 does not determine in this case a relevant contribution on the performance levels of the preamplifier circuit 20 in so far as it adds to a signal already previously amplified by the amplification stage 21.

In a similar way, where necessary, it is moreover possible to follow the amplification stage 21 of the preamplifier circuit 20 by a further gain stage (in addition or as an alternative to the aforesaid output stage 60). Advantageously, the noise of the further gain stage, fed back at input, is divided by the gain of the amplification stage 21 so as not to affect, other than marginally, the overall noise performance levels of the preamplifier circuit 20.

Advantages of the preamplifier circuit are clear from the foregoing description.

One embodiment enables amplification of the capacitive variation signal from the detection structure of an acoustic transducer, at the same time enabling proper biasing thereof. In particular, the preamplifier circuit has high noise performance levels, is capable of eliminating any disturbance coming from the biasing network of the acoustic transducer, and moreover has a high power-supply rejection ratio (PSRR), thanks to the fully differential structure of the amplification stage constituting the input stage thereof.

In addition, the use of a reference generator circuit does not involve disadvantages in the majority of applications in so far as a reference of a bandgap type is usually already present on board the chip in which the preamplifier circuit is integrated.

The preamplifier circuit described can be integrated in common analog technologies (CMOS or biCMOS), not requiring any particular components for its operation, and is hence particularly suitable for being used both as preamplifier stage upstream of an analog-to-digital (ND) converter for an integrated digital microphone, and for an integrated analog microphone.

Figure 7:
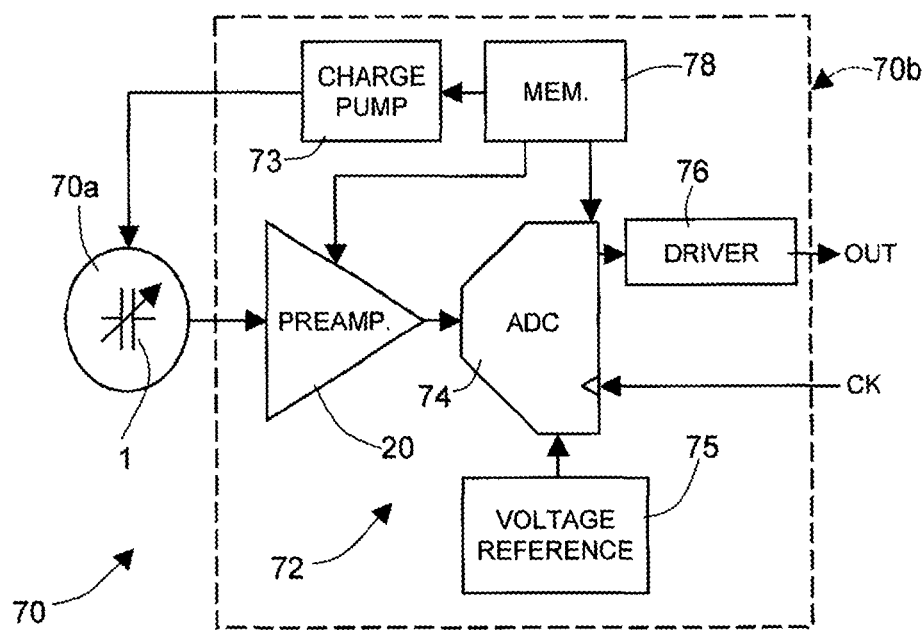
FIG. 7 shows a simplified block diagram of a capacitive acoustic transducer comprising the preamplifier circuit of FIG. 3 or FIG. 6.

In greater detail, FIG. 7 shows an acoustic transducer 70, in particular a MEMS capacitive microphone, in which the aforesaid preamplifier circuit 20 can advantageously be used.

The acoustic transducer 70 comprises in general two distinct blocks, each provided in a respective die of semiconductor material (designated as a whole by 70a and 70b in FIG. 7): the detection structure 1, basically constituted by the MEMS sensor sensitive to acoustic stimuli, and a readout-interface block 72 (provided as an ASIC), configured for correctly biasing the detection structure 1 and processing the generated capacitive variation signal for providing, on an output OUT of the acoustic transducer 70, a digital signal, which can subsequently be processed by a microcontroller of an associated electronic device.

The preamplifier circuit 20 previously described constitutes the first functional sub-block of the readout-interface block 72, which is designed to interface directly with the detection structure 1 and has a preamplifier function for amplifying (and appropriately filtering) the capacitive variation signal generated by the detection structure 1.

The readout-interface block 72 further comprises: a charge pump 73, which enables generation of an appropriate voltage for biasing the detection structure 1; an analog-to-digital converter 74, for example of the sigma-delta type, configured for receiving a clock signal CK and the differential signal amplified by the preamplifier circuit 20, of an analog type, and converting it into a digital signal; a reference-signal generator circuit 75, connected to the analog-to-digital converter 74 and designed to supply a reference signal for the analog-to-digital conversion; and a driver 76, designed to operate as an interface between the analog-to-digital converter 74 and an external system, for example a microcontroller of an associated electronic device.

In addition, the acoustic transducer 70 may comprise a memory 78 (of a volatile or non-volatile type), for example externally programmable so as to enable use of the acoustic transducer 70 according to different configurations (for example, gain configurations).

Advantageously, the two distinct dies integrating the detection structure 1 and the readout-interface block 72 can be housed in a single package, with an appropriate arrangement (for example, stacked, or side by side).

Figure 8:
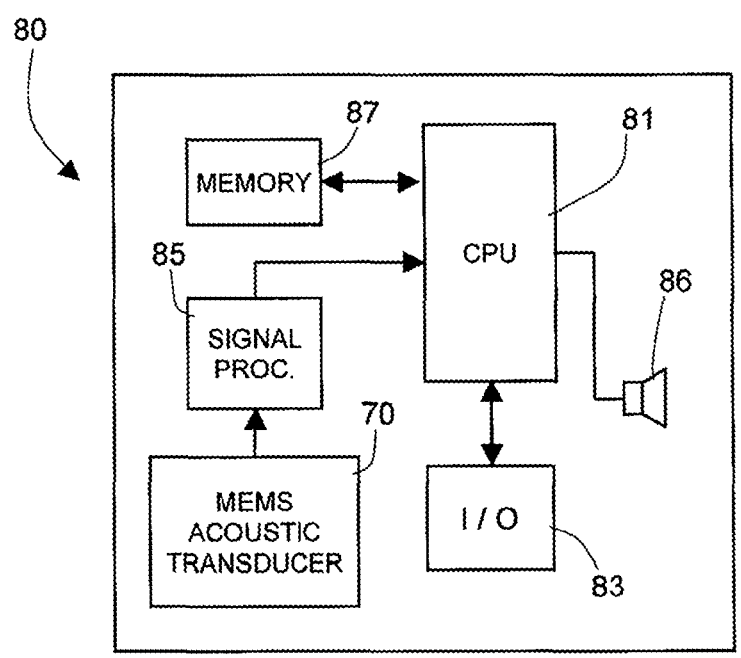
FIG. 8 shows a simplified block diagram of an electronic device provided with a capacitive acoustic transducer, according to a further embodiment.

The features previously listed hence render particularly advantageous the use of the preamplifier circuit 20, and of the acoustic transducer 70 in which the same circuit is implemented, in an electronic device 80, as shown in FIG. 8 (the electronic device 80 may comprise further acoustic transducers, in a way not illustrated).

The electronic device 80 is preferably a mobile-communication portable device, such as, for example, a mobile phone, a PDA, a notebook, but also a voice recorder, a reader of audio files with voice-recording capacity, etc. Alternatively, the electronic device 80 can be a hydrophone capable of operating under water, or a hearing-aid device.

The electronic device 80 comprises a microprocessor 81 and an input/output interface 83, for example provided with a keyboard and a display, connected to the microprocessor 81. The acoustic transducer 70 communicates with the microprocessor 81 via a signal-processing block 85 (which can carry out further processing operations of the digital signal at output from the acoustic transducer 70). In addition, the electronic device 80 can comprise a loudspeaker 86, for generating sounds on an audio output (not shown), and an internal memory 87.

Finally, it is clear that modifications and variations may be made to what has been described and illustrated herein, without departing from the scope of the present disclosure.

For example, the dummy capacitor 26 of the amplification stage 21, instead of being provided with standard technology in the die integrating the readout-interface circuit (ASIC), may be provided on the same die of semiconductor material integrating the detection structure 1, with the same integrated technology, so as to be even better matched to the characteristics of the capacitor provided by the same detection structure 1 (i.e., in such a way as to have substantially the same electrical characteristics and hence undergo the same variations as a function of external factors, such as ageing, temperature variations, etc.).

In addition, it is clear that the preamplifier circuit according to one embodiment can advantageously be used in different applications in which it is required to amplify a capacitive variation with high noise performance levels; for example, it can be used with different types of acoustic transducers (for example, capacitive microphones of a traditional type or electret microphones) or other types of sensors, both of a traditional and of a MEMS type.

The various embodiments described above can be combined to provide further embodiments. All of the U.S. patents, U.S. patent application publications, U.S. patent applications, foreign patents, foreign patent applications and non-patent publications referred to in this specification are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an acoustic transducer configured to generate a capacitive variation signal as a function of an acoustic signal;
a preamplifier circuit coupled to the acoustic transducer, the preamplifier circuit including:
a differential amplifier having first and second differential inputs and first and second differential outputs, the differential amplifier being coupled to the acoustic transducer and configured to amplify the capacitive variation signal to generate a differential output signal on the first and second differential outputs; and
a reference generator circuit configured to supply a biasing quantity to the differential amplifier and to generate the biasing quantity proportional to a reference voltage,
wherein the differential amplifier includes:
a first input transistor having a control terminal coupled to said first differential input, a first current-conduction terminal configured to receive the biasing quantity, and a second current conduction terminal coupled to a first resistive load element and the first differential output of the differential amplifier; and
a second input transistor having a control terminal coupled to said second differential input, a first current-conduction terminal configured to receive the biasing quantity, and a second current conduction terminal coupled to a second resistive load element and the second differential output of the differential amplifier.

2. The device of claim 1 wherein the acoustic transducer includes a microelectromechanical detection structure, the first differential input is coupled to the microelectromechanical detection structure, and the second differential input is coupled to a reference structure.

3. The device of claim 2 wherein the microelectromechanical detection structure is configured to generate said capacitive variation signal starting from a value of capacitance at rest, said preamplifier circuit including a reference capacitive element having a value of capacitance substantially equal to the value of capacitance at rest of the microelectromechanical detection structure, the reference structure including the reference capacitive element.

4. The device of claim 3, further comprising:
a first biasing circuit configured to bias said detection structure; and
a second biasing circuit configured to bias said reference capacitive element.

5. The device of claim 1 wherein a value of said biasing quantity is a biasing current correlated to a resistance value of the first and second resistive load elements.

6. The device of claim 5, wherein the reference generator circuit is configured to generate said biasing current in the form:

$$I_{BIAS} = V_{STAB}/(\alpha \cdot R_L)$$

where $V_{STAB}$ is the reference voltage that does not vary with temperature variations, $\alpha$ is a proportionality constant, and $R_L$ is the resistance value of the first and second resistive load elements.

7. The device of claim 6 wherein said reference generator circuit is a bandgap reference-voltage generator, and said reference voltage is a bandgap reference voltage, said bandgap reference-voltage generator being configured to provide said bandgap reference voltage across a first reference resistive element configured to generate said biasing current, said first reference resistive element having a same value of resistance as, and being matched to, the first and second resistive load elements.

8. The device of claim 7 wherein said bandgap reference-voltage generator comprises:
an operational amplifier having a first input and a second input;
a first transistor in diode configuration coupled to said first input, and a second transistor in diode configuration coupled to said second input via said first reference resistive element;
a second reference resistive element and a third reference resistive element both having a same value of resistance as, and matched to, the first and second resistive load, and coupled respectively to said first and second inputs;
a first reference transistor element and a second reference transistor element, coupled, respectively, to said first and second inputs and having a respective control terminal coupled to an output of said operational amplifier; and
an output transistor element having a respective control terminal coupled to the output of said operational amplifier and a current-conduction terminal configured to supply said biasing current.

9. The device of claim 1, further comprising a buffer stage coupled to at least one of the first differential output and the second differential output of said preamplifier circuit, the first and second differential outputs each having a low impedance.

10. A device, comprising:
an acoustic transducer configured to generate a capacitive variation signal as a function of an acoustic signal;
first and second biasing circuits; and
a preamplifier circuit coupled to the acoustic transducer, the preamplifier circuit including:
a differential amplifier having first and second differential inputs and first and second differential outputs, the differential amplifier being coupled to the acoustic transducer and configured to amplify the capacitive variation signal to generate a differential output signal on the first and second differential outputs, and a reference generator circuit configured to supply a biasing quantity to the differential amplifier and to generate the biasing quantity proportional to a reference voltage, wherein:

the acoustic transducer includes a microelectromechanical detection structure, the first differential input is coupled to the microelectromechanical detection structure, and the second differential input is coupled to a reference structure, the microelectromechanical detection structure is configured to generate said capacitive variation signal starting from a value of capacitance at rest, said preamplifier circuit including a reference capacitive element having a value of capacitance substantially equal to the value of capacitance at rest of the microelectromechanical detection structure, the reference structure including the reference capacitive element, the first biasing circuit is configured to bias said detection structure, the second biasing circuit is configured to bias said reference capacitive element, and a first terminal of said micromechanical detection structure is coupled to a first terminal of said reference capacitive element, the micromechanical detection structure and the reference capacitive element being configured to receive a first biasing voltage at respective first terminals, said first biasing circuit including a first resistive biasing element having high impedance, the first resistive biasing element being coupled between said first differential input and a second biasing voltage, said second biasing circuit including a second resistive biasing element having said high impedance, the second biasing circuit being coupled between said second differential input and said second biasing voltage.

11. The device of claim 10 wherein said differential amplifier has a capacitive filter element coupled between said first differential output and the second differential output.

12. A readout-interface circuit, comprising:

a preamplifier circuit configured to receive a capacitive variation signal from a MEMS detection structure and to amplify the capacitive variation signal, the preamplifier circuit including:

an amplification stage configured to generate a differential output signal based on the capacitive variation signal, the amplification stage including a fully differential amplifier configured to receive and to amplify the capacitive variation signal, the differential amplifier including first and second differential inputs and first and second differential outputs; and a reference generator circuit configured to supply a biasing quantity to the differential amplifier and to generate said biasing quantity proportional to a reference voltage wherein the differential amplifier includes:

a first input transistor having a control terminal coupled to the first differential input, a first current-conduction terminal configured to receive the biasing quantity, and a second current conduction terminal coupled to a first resistive load element and the first differential output of the differential amplifier; and a second input transistor having a control terminal coupled to said second differential input, a first current-conduction terminal configured to receive the biasing quantity, and a second current conduction terminal coupled to a second resistive load element and the second differential output of the differential amplifier.

13. The readout-interface circuit according to claim 12 further comprising an analog-to-digital converter coupled to an output of said preamplifier circuit and configured to supply a digital signal correlated to said capacitive variation signal.

14. An acoustic transducer, of a capacitive type, comprising:

a microelectromechanical detection structure configured to generate a capacitive variation signal as a function of an acoustic signal; and a readout-interface circuit coupled to the microelectromechanical detection structure, the readout-interface circuit including:

a differential amplifier having first and second differential inputs and first and second differential outputs, the differential amplifier being configured to be directly coupled to the microelectromechanical detection structure to generate a differential output signal based on the capacitive variation signal; and a reference generator circuit configured to supply a biasing quantity to the differential amplifier and to generate said biasing quantity proportional to a reference voltage wherein the differential amplifier includes:

a first input transistor having a control terminal coupled to said first differential input, a first current-conduction terminal configured to receive the biasing quantity, and a second current conduction terminal coupled to a first resistive load element and the first differential output of the differential amplifier; and a second input transistor having a control terminal coupled to said second differential input, a first current-conduction terminal configured to receive the biasing quantity, and a second current conduction terminal coupled to a second resistive load element and the second differential output of the differential amplifier.

15. The acoustic transducer according to claim 14 wherein the microelectromechanical detection structure is integrated in a first die of semiconductor material, and said readout-interface circuit is integrated in a second die of semiconductor material, and wherein said first and second dies of semiconductor material are housed together in a same package.

16. A device comprising:

a microprocessor control unit; and an acoustic transducer coupled to said microprocessor control unit, the acoustic transducer including:

a MEMS detection structure configured to generate a capacitive variation signal as a function of an acoustic signal; and a readout-interface circuit coupled to the MEMS detection structure, the readout-interface circuit having:

an amplification stage configured to generate a differential output signal correlated to said capacitive variation signal, the amplification stage including a fully differential amplifier configured to be coupled to said MEMS detection structure and to amplify said capacitive variation signal, the differential amplifier including first and second differential inputs and first and second differential outputs; and a reference generator circuit configured to supply a biasing quantity to the differential amplifier and to generate said biasing quantity proportional to a reference wherein the differential amplifier includes:
a first input transistor having a control terminal coupled to said first differential input, a first current-conduction terminal configured to receive the biasing quantity, and a second current conduction terminal coupled to a first resistive load element and the first differential output of the differential amplifier; and
a second input transistor having a control terminal coupled to said second differential input, a first current-conduction terminal configured to receive the biasing quantity, and a second current conduction terminal coupled to a second resistive load element and the second differential output of the differential amplifier.

17. The device according to claim 16, wherein the device is an electrical device chosen from the group consisting of a mobile phone, a PDA, a notebook, a voice recorder, an audio player with functions of voice recorder, a console for videogames, a hydrophone, and a hearing-aid device.

18. A method comprising:
generating a first electrical signal from a MEMS capacitor;
supplying the first electrical signal directly to a first input of a differential amplifier;
generating a second electrical signal from a reference capacitor;
supplying the second electrical signal to the second input of the differential amplifier;
generating a biasing quantity according to a bandgap reference voltage, a stability of the biasing quantity corresponding to a stability of the bandgap reference voltage; and
supplying the biasing quantity to the differential amplifier.

19. The method of claim 18 wherein the biasing quantity is a biasing current.

20. The method of claim 19 comprising generating said biasing current in the form:

$$I_{BIAS} = V_{STAB}/(\alpha \cdot R_L)$$

where $V_{STAB}$ is the reference voltage, a is a proportionality constant, and $R_L$ is a resistance value of load-resistive elements of the differential amplifier.

21. A device comprising:
an acoustic transducer circuit, the acoustic transducer circuit including:
a MEMS capacitor having a first and a second terminal, the first terminal of the MEMS capacitor configured to receive a bias voltage;
a reference capacitor having a first and a second terminal, the first terminal of the reference capacitor configured to receive the bias voltage;
a differential amplifier having a first and a second differential input, the first differential input coupled to the second terminal of the MEMS capacitor, the second differential input coupled to the second terminal of the reference capacitor; and
a generator circuit configured to generate a bandgap reference voltage, to generate a biasing quantity, the bandgap reference voltage being configured to control the biasing quantity, and to supply the biasing quantity to the differential amplifier.

22. The device of claim 21 wherein the differential amplifier comprises:
a first differential output;
a second differential output; and
a filter capacitor coupled between the first and the second differential outputs.

23. The device of claim 22 wherein the acoustic transducer circuit comprises a buffer stage coupled to the first and second differential outputs.

24. The device of claim 21 comprising a microprocessor coupled to the acoustic transducer circuit and configured to process a signal received from the acoustic transducer circuit.

25. The device of claim 24 comprising
a signal processor coupled to the microprocessor;
a memory coupled to the microprocessor; and
an input/output interface coupled to the microprocessor.

26. The device of claim 21 wherein the biasing quantity is a biasing current.

* * * * *